(12) United States Patent
Ogawa

(10) Patent No.: US 6,654,242 B2
(45) Date of Patent: Nov. 25, 2003

(54) ELECTRONIC APPARATUS WITH BUILT-IN CPU

(75) Inventor: Naohisa Ogawa, Gunma (JP)

(73) Assignee: NEC Corporation, Tokyo (JP)

(*) Notice: Subject to any disclaimer, the term of this patent is extended or adjusted under 35 U.S.C. 154(b) by 42 days.

(21) Appl. No.: 10/000,399

(22) Filed: Dec. 4, 2001

(65) Prior Publication Data
US 2002/0067595 A1 Jun. 6, 2002

(30) Foreign Application Priority Data
Dec. 5, 2000 (JP) ........................... 2000-369634

(51) Int. Cl.⁷ ................................................ G06F 1/16
(52) U.S. Cl. ..................... 361/687; 361/692; 361/695; 454/184
(58) Field of Search ........................ 361/687–692, 361/704, 707, 714; 454/184

(56) References Cited

U.S. PATENT DOCUMENTS

| | | | |
|---|---|---|---|
| 4,949,218 A | * 8/1990 | Blanchard et al. | 361/696 |
| 5,493,457 A | * 2/1996 | Kawamura et al. | 369/75.1 |
| 5,813,243 A | * 9/1998 | Johnson et al. | 62/259.2 |
| 6,113,485 A | * 9/2000 | Marquis et al. | 454/184 |
| 6,400,567 B1 | * 6/2002 | McKeen et al. | 361/695 |

FOREIGN PATENT DOCUMENTS

| | | |
|---|---|---|
| JP | 63-173111 | 7/1988 |
| JP | 10-093274 | 4/1998 |
| JP | 10-124179 | 5/1998 |

* cited by examiner

Primary Examiner—Darren Schuberg
Assistant Examiner—Anthony Q. Edwards
(74) Attorney, Agent, or Firm—Whitham, Curtis & Christofferson, PC

(57) ABSTRACT

An electronic apparatus having a built-in CPU is provided, which prevents other electronic devices/units mounted in a casing along with a built-in CPU from being badly affected by the heat generated by the CPU even if the mounting density of electronic devices and/or units in the casing progresses and the heat amount generated by the CPU increases. The electronic apparatus comprises: (a) a casing having a first air inlet and a first air outlet; (b) t least one electronic device/unit mounted in the casing; (c) a CPU mounted in the casing; the CPU cooperating with the at least one electronic device/unit to realize desired functions; the CPU having a first fan for cooling the same; and (d) a partition fixed in the casing in such a way as to form a first room and a second room; the CPU and the first fan being placed in the first room; the at least one electronic device/unit being placed in the second room. The he air is introduced into the first room through the first air inlet with an operation of the first fan and then, discharged from the first room through the first air outlet without contacting the least one electronic device/unit. Preferably, a duct is additionally provided to interconnect the first fan for the CPU with the first air inlet in the first room.

16 Claims, 4 Drawing Sheets

ELECTRONIC APPARATUS WITH BUILT-IN CPU

BACKGROUND OF THE INVENTION

1. Field of the Invention

The present invention relates to an electronic apparatus with a built-in CPU (Central Processing Unit). More particularly, the invention relates to an electronic apparatus with a built-in CPU that has a cooling structure for cooling the inside of the apparatus by effectively removing or dissipating the heat generated by the CPU.

2. Description of the Related Art

Conventionally, with an electronic information processing system or apparatus such as a personal computer, at least one cooling fan is mounted along with at least one built-in CPU. This is to discharge effectively the heat generated by the CPU to the outside of the casing. To meet this need, various techniques have been developed. Examples of these techniques are disclosed by the Japanese Non-Examined Patent Publication Nos. 10-93274 and 10-124179 both published in 1998, and the Japanese Patent No. 2577731 published in 1996 (which corresponds to the Japanese Non-Examined Patent Publication No. 63-173111 published in 1988).

The Publication No. 10-93274 discloses the cooling structure of information processing apparatuses or systems (e.g., personal computers) that increases the cooling efficiency while suppressing the noise caused by the cooling fan or fans. In this structure, a partition is provided in the casing having an air inlet and an air outlet, thereby forming a room to surround a cooling fan and heat generators (e.g., CPUs) mounted in the casing. The fan and the heat generators are almost separated by the partition from the other electronic units or devices mounted in the casing. The room is formed to communicate with the air inlet of the casing. The partition has an opening for allowing the flowing air generated by the cooling fan in the room to go out of the room. An air path is formed in the casing in such a way as to interconnect the opening of the partition with the air outlet of the casing. The air path is like a spiral while the opening of the partition is set as the spiral center.

With the cooling structure of the Publication No. 10-93274, the flowing air generated by the cooling fan in the room, which includes heat generated by the heat generators, will be emitted to the outside of the room through the opening of the partition. Thereafter, the flowing air will pass through the air path to the air outlet of the casing and then, it will go out of the casing through the air outlet. Preferably, the cooling fan is formed by a centrifugal fan.

The Publication No. 10-124179 discloses an information processing apparatus (e.g., a personal computer) with a cooling structure that improves the cooling efficiency. In this structure, a flexible disk drive (FDD) unit and a compact disk read-only memory (CD-ROM) unit are mounted in the casing in such a way as to be entirely overlapped with each other in their horizontal state. A hard disk drive (HDD) unit is mounted in its vertical state to be adjacent to the FDD and the CD-ROM units in the casing. A power supply unit is mounted in the rear of the FDD, CD-ROM, and HD units in the casing. Thus, a considerably wide space is formed near the power supply unit in the casing.

A set of air inlets is only formed at the left-side wall of the casing near its front wall. An air flow is generated by the fan built in the power supply unit so as to extend from the set of air inlets to a set of air outlets formed at the rear wall of the casing. The air flow thus formed in the casing is like an L character. The flowing air will pass by not only the HDD unit but also the FDD and CD-ROM units, thereby cooling efficiently these units while suppressing the cooling noise.

With the cooling structure of the Publication No. 10-124179, the HDD, FDD, and CD-ROM units can be mounted on the right side in the casing near its front wall with the use of an appropriate mounting member. Thereafter, the power supply unit wider than the CD-ROM unit can be mounted in the casing. Moreover, the HDD, FDD and CD-ROM units and the power supply unit can be efficiently cooled by the air introduced into the casing through the set of air inlets.

The U.S. Pat. No. 2,577,731 discloses a personal computer with a cooling structure that makes it possible to cool efficiently the inside of the computer with a single cooling fan and that decreases the noise and cost. In this computer, a disk unit a power supply unit, a cooling fan, and a circuit unit are mounted in a casing. The disk unit, which is placed near the front wall of the casing, is designed in such a way that the air enters the inside of the unit and penetrates through the same. The power supply unit, which is placed in rear of the disk unit, is designed in such a way that the air enters the inside of the unit and penetrates through the same.

The casing comprises an attachment plate for dividing the inner space or the casing into an upper first room and a lower second room, and a set of air inlets for introducing the outside air into the first and second rooms. The disk unit and the power supply unit are placed in the first room while the circuit unit is placed in the second room.

The cooling fan discharges the inside air in the second room to the outside of the casing. At the same time, the fan discharges the inside air in the first room, which is introduced through the opening of the disk unit and the set of air inlets, to the outside of the casing by way of the inside of the power supply unit. Thus, the air introduced through the disk unit passes through the power supply unit, thereby improving the cooling efficiency.

With the computer of the U.S. Pat. No. 2,577,731 due to the blowing action of the cooling fan, the power supply unit and the disk-unit placed in the first room can be cooled and at the same time, the circuit unit placed in the second room can be cooled. Therefore, the inside of the casing can effectively be cooled with the single cooling fan. This means that satisfactory cooling effect is realized with a single cooling fan and thus, cooling noise and fabrication cost are lowered.

In recent years, the mounting density of electronic devices and/or units in the casing has been progressing and at the same time, the heat mount generated in the casing has been increasing steadily with the improving performance or the CPU. Therefore, it has become considerably difficult to discharge efficiently the heat generated in the casing to the outside. In other words, there is an increasing danger that some of the heat generated by the CPU tends to be confined in the casing and as a result, the confined heat will apply bad effects to the other electronic devices and/or units mounted in the casing. In the near future, the above-described trend will be promoted more and accordingly, there will arise a serious problem how the heat generated by the CPU is efficiently discharged from the casing, in other words, how to cool the inside of the casing effectively.

With the above-described technique disclosed by the Publication No. 10-93274, the CPU is almost separated by the partition from the other electronic units or devices in the casing in such as way that a spiral-shaped flow of air is formed in the casing. Therefore, the heat generated by the CPU is circulated by the air flow in the entire casing and then, discharged to the outside from the casing. As a result, there is a problem that the heat generated by the CPU tends to apply a bad effect to the other electronic units or devices, such as the HDD and FDD units, mounted in the casing.

With the above-described techniques disclosed by the Publication No. 10-124179 and the U.S. Pat. No. 2,577,731, the heat generated by the CPU is circulated by the air flow in the entire casing and then, discharged to the outside from the casing. As a result, the same problem as the Publication No. 10-93274 will occur.

SUMMARY OF THE INVENTION

Accordingly, an object of the present invention is to provide an electronic apparatus that prevents other electronic devices/units mounted in a casing along with a built-in CPU from being badly affected by the heat generated by the CPU even if the mounting density of electronic devices and/or units in the casing progresses and the heat amount generated by the CPU increases.

Another object of the present invention is to provide an electronic apparatus that dissipates more efficiently the heat generated by a built-in CPU from the casing with a simple measure.

The above objects together with others not specifically mentioned will become clear to those skilled in the art from the following description.

An electronic apparatus according to the invention comprises:
(a) a casing hating a first air inlet and a first air outlet;
(b) at least one electronic device/unit mounted in the casing;
(c) a CPU mounted in the casing;
   the CPU cooperating with the at least one electronic device/unit to realize desired functions;
   the CPU having a first fan for cooling the same; and
(d) a partition fixed in the casing in such a way as to form a first room and a second room;
   the CPU and the first fan being placed in the first room:
   the at least one electronic device/unit being placed in the second room;
   wherein the air is introduced into the first room through the first air inlet with an operation of the first fan and then, discharged from the first room through the first air outlet without contacting the least one electronic device/unit.

With the electronic apparatus according to the inventions the casing has the first air inlet and the first air outlet. The CPU mounted in the casing has the first fan for cooling the CPU itself. The partition is fixed in the casing in such a way as to form the first room and the second room. The CPU and the first fan are placed in the first room while the at least one electronic device/unit is placed in the second room. The air is introduced into the first room of the casing through the first air inlet with the operation of the first tan and then, discharged from the first room through the first air outlet without contacting the least one electronic device/units.

As result, even if the mounting density of the electronic devices and/or units in the casing progresses and the heat amount generated by the CPU increased, the at least one electronic device/unit is prevented from being badly affected by the heat generated by the built-in CPU.

Moreover, the air including the heat generated by the built-in CPU in the first room does not contact the least one electronic device/unit in the second room. The air in the first room is immediately discharged from the first room through the first air outlet. As a result, the heat generated by the CPU is dissipated more efficiently from the casing with a simple measure of fixing the partition in the casing.

In a preferred embodiment of the apparatus according to the invention, a duct is additionally provided to interconnect the first fan for the CPU with the first air inlet in the first room. In this embodiment, there is an additional advantage that the cooling effect for the CPU is enhanced.

In another preferred embodiment of the apparatus according to the invention, the partition has a heat-insulating property. For example, the partition is made of a heat-insulating material, or the partition is covered with a heat-insulating member or material. In this embodiment, there is an additional advantage that the effect of the heat generated by the CPU in the first roam to the at least one electronic device/unit in the second room can be shielded or blocked almost completely.

In still another preferred embodiment of the apparatus according to the invention, a second air inlet formed at the casing in the second room, a second air outlet formed at the casing in the second room to be opposite to the second air inlet, and a second fan mounted to race the second air outlet in the second room are additionally provided. The second air inlet is used to introduce the air into the second room. The second air outlet is used to discharge the air introduced into the second room to the outside of the casing in such a away as to contact the least one electronic device/unit. In this embodiment, there is an additional advantage that the least one electronic device/unit in the second room is cooled efficiently by the air flowing through the second room from the second air inlet to the second air outlet.

BRIEF DESCRIPTION OP THE DRAWINGS

In order that the present invention may be readily carried into effect, it will now be described with reference to the accompanying drawings.

DETAILED DESCRIPTION OF THE PREFERRED EMBODIMENTS

Figure 1:
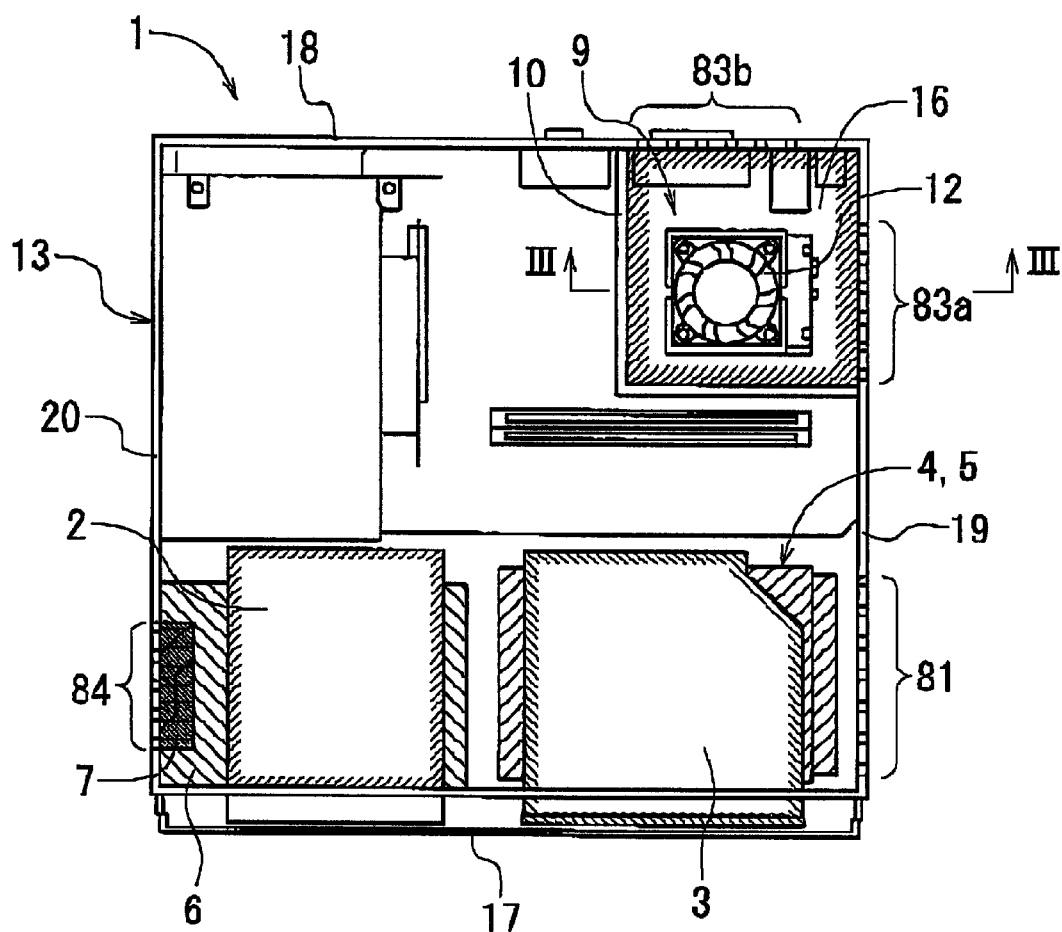
FIG. 1 is a schematic plan view showing the inside structure of an electronic apparatus according to an embodiment of the invention, in which the top wall of the casing and the electronic units/devices and parts mounted in the casing that has no relation to the invention are omitted for clarification.

Preferred embodiments of the present invention will be described in detail below while referring to the drawings attached.

Figure 2:
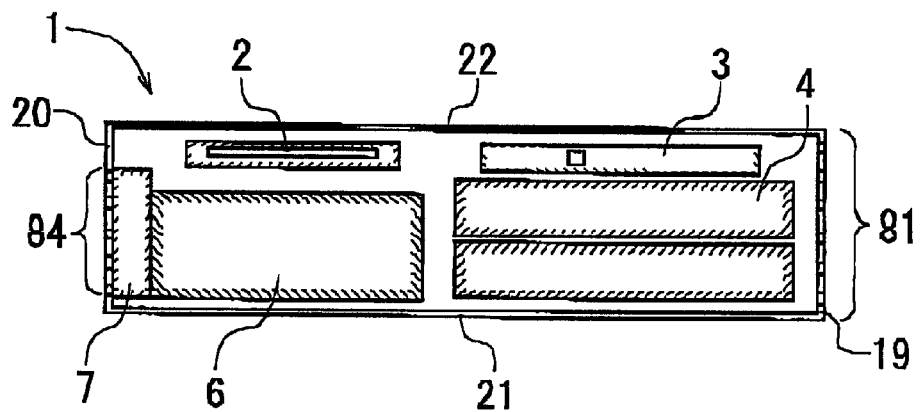
FIG. 2 is a schematic front view showing the inside structure of the electronic apparatus according to the embodiment of FIG. 1, in which the front wall of the casing is omitted.

FIGS. 1 and 2 schematically show an electronic apparatus 1 with a built-in CPU according to an embodiment of the invention, in which the apparatus 1 is constituted as a personal computer, one of the various information processing systems or apparatuses. In FIG. 1, the top wall of the casing is omitted to expose its inside structure. In FIG. 2, the front wall of the casing is omitted to expose its inside structure.

The apparatus 1 of the embodiment comprises a casing 13 with a shape of approximately rectangular parallelepiped, which is formed by a front wall 17, a rear wall 18, a first (i.e., right) side wall 19, a second (i.e., left) side wall 20, a bottom wall 21, and a top wall 22.

In the casing 13, a FDD unit 2, a CD-ROM unit 3, a first HDD unit 4, a second HDD unit 5, a power supply unit 6 with a built-in fan 7 are mounted at their respective locations near the front wall 17. The FDD unit 2, the CD-ROM unit 3, the first and second HDD units 4 and 5, and the power supply unit 6 are electronic units.

The first side wall 19, which is located on the right side of FIG. 1, has a set of slits 81 for introducing the air from the outside into the casing 13. The set of slits 81 is located near the front wall 17 and is opposed to the right-hand sides of the CD-ROM drive 3 and the HDD drives 4 and 5. The set of slits 81 serves as a "second air inlet".

The second side wall 20, which is located on the left side of FIG. 1, has a set of slits 84 for discharging the air in the casing 13 to the outside. The set of slits 84 is located near the front wall 17 and is opposed to the power supply unit 6. The set of slits 84 serves as a "second air outlet". The fan 7 is designed for cooling the power supply unit 6 and combined with the same. The fan 7 is fixed closely to the slits 84 and is faced to the same.

Needless to say, although the fan 7 is built in the power supply unit 6 in this embodiment, the fan 7 is mounted separately from the unit 6.

The sets of the slits 81 and 84 are placed outside a CPU room 16 explained in detail later.

As seen from FIG. 1, the slits 81 are placed to be opposed to the slit 84 while the FDD unit 2, the CD-ROM unit 3, the HDD units 4 and 5, and the power supply unit 6 are placed between the slits 81 and 84 Therefore, the air is introduced by the operation of the fan 7 into the casing 13 through the slits 81 (i.e., the second air inlet) and then, it flows to pass by the units 2, 3, 4, 5, and 6 toward the opposite slits 84. Thereafter, the air is discharged through the slits 84 (i.e., the second air outlet) from the casing 13 by the operation of the fan 7.

The CPU room 16 is formed at the right-side rear corner of the casing 13, in which a CPU section 9 is placed. The room 16 is formed to separate the CPU section 9 from the units 2, 3, 4, 5 and 6, in other words, to isolate the CPU section 9 from these units 2 to 6.

The CPU room 16 is defined by a L-shaped partition or wall 10 whose lateral ends are connected to the first side wall 19 and the rear wall 18, respectively. The vertical ends (i.e., the top and bottom ends) of the partition 10 are connected to the top and bottom walls 22 and 21, respectively. The room 16 has a horizontal cross section of approximately square in this embodiment, as shown in FIG. 1. The partition 10 is made of a heat-insulating material, which ensures the thermal separation of the CPU section 9 from the remaining section.

Figure 3:
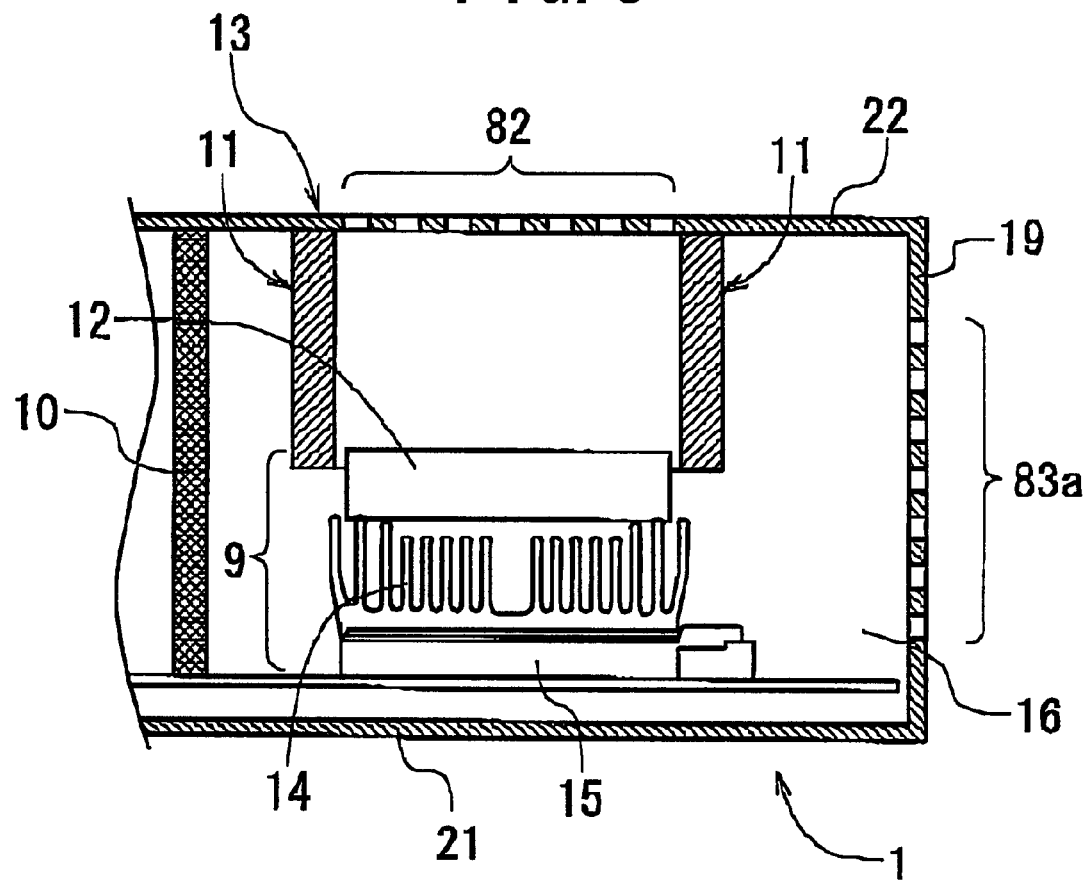
FIG. 3 is an enlarged, partial cross-sectional view along the line III—III in FIG. 1, which shows the inside structure of the CPU room (i.e., the first room) of the electronic apparatus according to the embodiment of FIG. 1.

FIG. 3 shows the detailed structure of the CPU section 9 and its neighborhood. As shown in FIG. 3, the section 9 comprises a CPU 15 mounted on a specific circuit board (i.e. a mother board), a heat-radiating plate (i.e., heat sink) 14 integrated with the top of the CPU 15, and a cooling fan 12 attached to the plate 14. The circuit board is fixed to the bottom wall 21 of the casing 13. The plate 14 and the fan 12 are used to cool the CPU 15, in other words, to dissipate the heat generated in the CPU 15 on operation to the outside of the section 9.

To maximize the heat-dissipating area or performance of the heat-dissipating plate 14 without expanding its occupation area, several rod-shaped projections are formed on the upper surface of the plate 14. The fan 12 is placed at the top of the projections of the plate 14.

The heat-dissipating plate 14 maybe fixed to the underlying circuit board with a known suitable attachment, not to be integrated with the CPU 15. Similarly, the fan 12 may be fixed to the underlying CPU 15 or the circuit board with a known suitable attachment. These structures are well known and thus, no further explanation is presented here.

In the CPU room 16, a set of slits 82 is formed at the top plate 22 of the casing 13. The set of slits 82, which serves as a "first air inlet", is positioned to face the top of the fan 12 or CPU 15. A hollow duct 11, which is like a square pillar with its top and bottom open, is fixed to the inner surface of the top wall 22, as clearly shown in FIG. 3. The duct 11 has a horizontal cross section of approximately square in such a way as to entirely overlap with the CPU section 9. The duct 11 serves to form a vertical air path that interconnects the cooling fan 12 with the set of slits 82. Thus, by the operation of the cooling fan 12, the outside air can be directly introduced into the duct 11 through the slits 82 and then, it can be blown downward to the heat-radiating plate 14 through the fan 12. The air thus blown is expanded to the neighborhood of the section 9 in the room 16 by way of the gaps between the adjoining rod-shaped projections of the plate 14.

A set of slits 83a, which serves as a "first air outlet", is formed at the side plate 19 of the casing 13. The set of slits 83a is positioned to face the opposing side face of the CPU section 9 in the CPU room 16. A set of slits 83b, which serves as the "first air outlet" as well, is formed at the rear wall 18 of the casing 13. The set of slits 83b is positioned to face the opposing rear face of the section 9 in the room 16. The outside air, which has been introduced into the room 16 through the set of slits 82 and the duct 11, can be discharged to the outside through the sets of slits 83a and 83b by the blowing operation of the fan 12.

Thus, by the operation of the cooling fan 12, "introduction of the outside air into the CPU room 16", "cooling of the CPU 15 by blowing the air thus introduced to the plate 14", and "discharge or dissipation of the heat generated by the CPU 15" can be performed.

Figure 4:
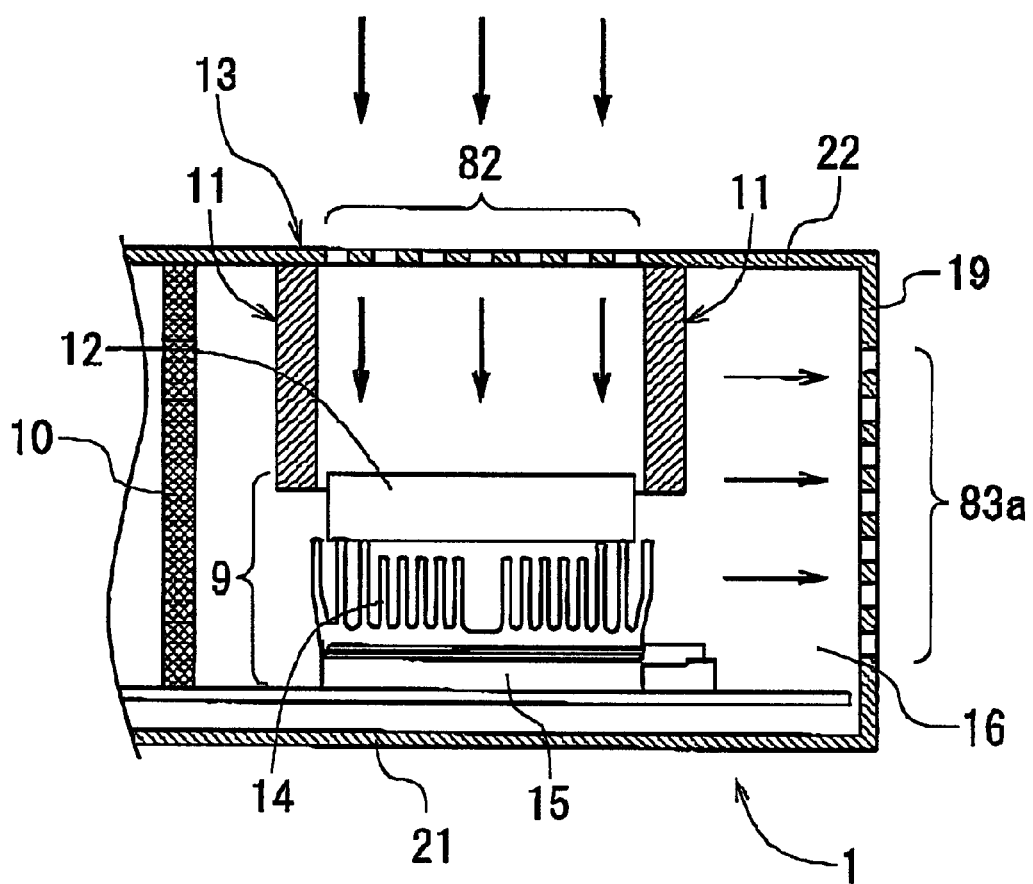
FIG. 4 is an enlarged, partial cross-sectional view along the line III—III in FIG. 1, which schematically shows the state of the flowing air in the CPU room of the electronic apparatus according to the embodiment of FIG. 1.

FIG. 4 shows the state of the air flow in the CPU room 16. The hollow duct 11 is mounted vertically in the room 16 to interconnect the set of slits 82 with the cooling fan 12 of the CPU 15. Therefore, the outside air can be directly introduced into the room 16 with the fan 12 by way of the set of slits 82 and the duct 11 without passing through the remaining region of the casing 13, forming the vertical flow of air, as shown by the vertical arrows in FIG. 4. Then, the air thus introduced is blown to the heat-dissipating plate 14 and reflected by the same, resulting in the approximately horizontal flow of air, as shown by the horizontal arrows in FIG. 4. The air thus blown to the outside of the duct 11 in the room 16 is automatically pushed out to the outside of the casing 13 by way of the slits 83a and 83b directly.

Since the heat-dissipating plate 14 is contacted with the underlying CPU 15, the heat generated in the CPU 15 is easily conducted and sunken to the plate 14. The heat existing in the plate 14 is efficiently brought to the outside of the casing 13 by the flowing air.

The CPU section 9 is located in the CPU room 16 and completely separated by the heat-insulating partition 10 from the units 2, 3, 4, 5, and 6. Therefore, the air introduced into the room 16 is brought out of the room 16 by way of the slots 83*a* and 83*b* along with the heat without contacting the units 2, 3, 4, 5, and 6. This means that the heat generated by the CPU 15 never affects the units 2, 3, 4, 5, and 6 at all.

Figure 5:
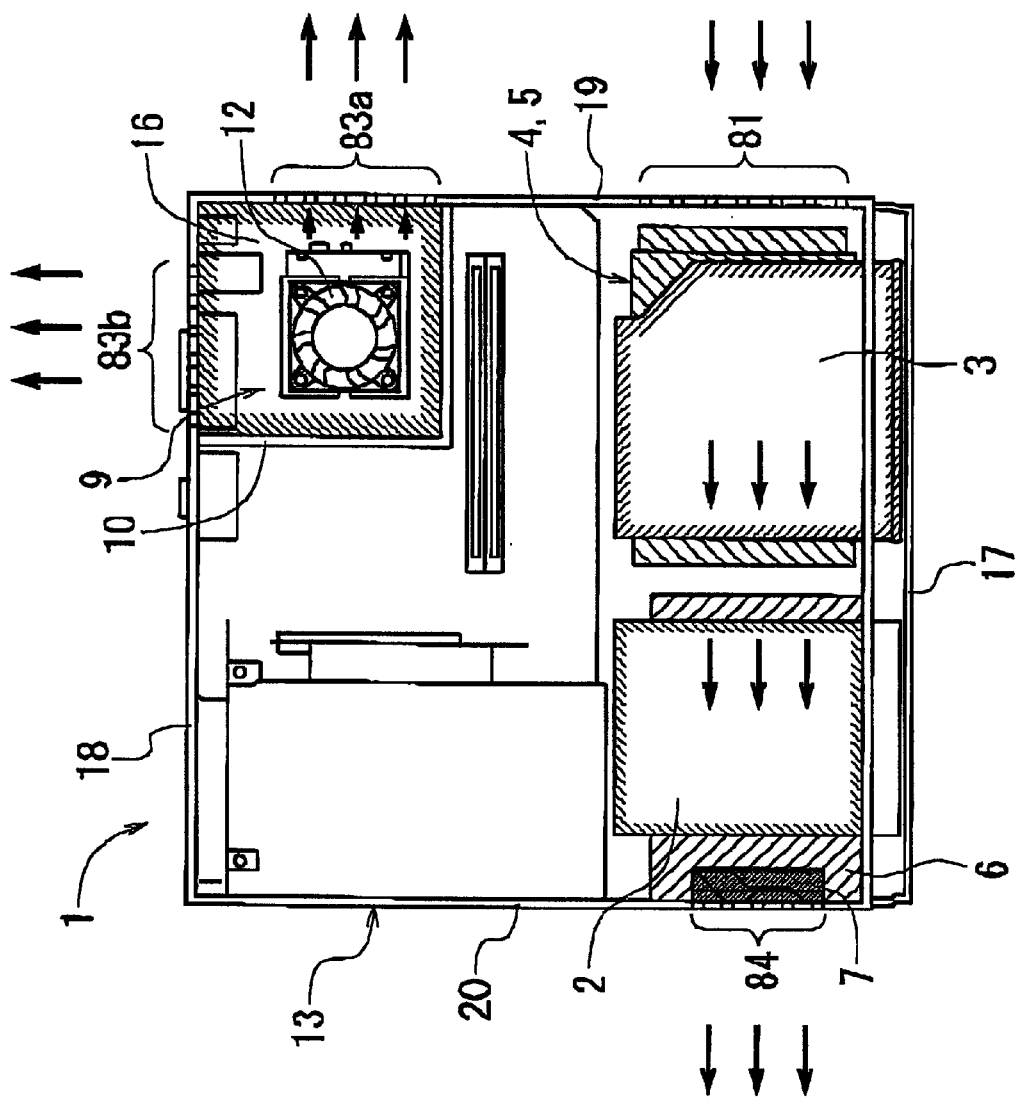
FIG. 5 is a schematic plan view of the electronic apparatus according to the embodiment of FIG. 1, which schematically shows the state of the flowing air in the whole casing of the apparatus.

FIG. 5 shows the state of the air flow of the entire apparatus 1 of the embodiment.

Since the CPU section 9 is separated from the units 2, 3, 4, 5, and 6 with the partition 16, the heated air generated by the heat from the CPU 15 in the CPU room 16 is not circulated in the remaining region of the caging 13. This means that the heated air by the CPU 15 is not contacted with the units 2, 3, 4, 5, and 6. The heated air is immediately pushed out to the outside of the room 16 and the casing 13 through the slits 83*a* and 83*b*. This is already explained as above.

The FDD unit 2, the CD-ROM unit 3, the HDD units 4 and 5, and the power supply unit 6, which are located outside the CPU room 16 in the casing 13, are cooled in the following way:

By the operation of the cooling fan 7 of the power supply unit 6, the outside air is introduced into the casing 13 through the set of slits 81 at the right side wall 19 of the casing 13. Then, the air thus introduced flows to pass by the CD-ROM and HDD units 3, 4, and 5, thereby removing the heat generated by these units 3 to 5. Thereafter, the air that has included the heat from the units 3 to 5 flows to pass by the FDD unit 2 and the power supply unit 6, thereby removing the heat generated by these units 2 and 6. The air that has included the heat from the units 2 to 6 is then discharged through the set of slits 84 at the left side wall 20 of the casing 13 to the outside of the same. Accordingly, all the units 2, 3, 4, 5, and 6 are efficiently cooled by the air flow formed by the fan 7.

With the electronic apparatus 1 according to the embodiment of the invention, the CPU section 9, which includes the CPU 15, the heat-dissipating plate 14, and the cooling fan 12, is confined in the CPU room 16. The set of slits 82 for direct air introduction into the CPU room 16 defined by the heat-insulating partition 10 is formed at the top wall 22 of the casing 13. At the same time, the sets of slits 83*a* and 83*b* for direct air discharge from the room 16 are formed at the first side wall 19 of the casing 13. Thus, the sets of slits 82 and 83*a* and 83*b* are dedicated to the air introduction and air discharge for the CPU 15.

On the other hand, the FDD unit 2, the CD-ROM unit 3, the HDD units 4 and 5, and the power supply unit 6 are separated from the CPU section 9 with the partition 10 In the casing 13. The set of slits 81 for direct air introduction are formed at the first side wall 19 of the casing 13 to face the CD-ROM and HDD units 3, 4, and 5. The set of slits 84 for air discharge are formed at the second side wall 20 of the casing 13 to face the FDD unit 2 and the power supply unit 6.

Accordingly, the CPU 15 can be cooled in the CPU room 16 by its dedicated air flow formed by the fan 12 while the units 2 to 6 can be cooled in the remaining part of the casing 13 by their dedicated air flow formed by the fan 7. This means that the CPU 15 can be cooled efficiently separately from the units 2 to 6.

Furthermore, the units 2, 3, 4, and 5 and the power supply unit 6 with the fan 7 are placed in the area near the front wall 17. The sets of slits 81 and 84 are placed in the same area as the units 2 to 6. While the air introduced into the casing 13 through the slits 81 flows to the opposing slits 84, the air will contact all the units 2 to 6 and remove effectively the heat generated therein. As a result, these units 2 to 6 can be cooled effectively.

The CPU section 9 is separated from the units 2 to 6 with the partition 10 made of a heat-insulating material. Therefore, there is no possibility that the heat generated in the CPU 15 affects badly the units 2 to 6 even if the mounting density of the units 2 to 6 in the casing 13 progresses and the heat amount generated by the CPU 15 increases. Since the duct 11 is additionally provided to interconnect the slots 82 with the fan 12 for the CPU 15, the cooling effect for the CPU section 9 is enhanced.

Variations

It is needless to say that the invention is not limited to the above-described embodiment. Any change or modification may be added to the embodiment within the spirit of the invention. For example, the invention is applied to a personal computer in the above-described embodiment. However, the invention may be applied to any other electronic apparatus or system having at least one built-in CPU than personal computers.

Although one CPU 15 is provided in the casing 13 in the above-described embodiment, two or more CPUs may be provided in the casing 13 according to the necessity. In this case, two or more CPUs may be confined in a CPU room to separate it from other electronic units and/or devices. Alternately, two or more CPUs may be confined in their own CPU rooms, in which their CPU rooms may be defined with their own partitions.

It is preferred that the CPU room 16 is located at one of the two rear corners of the casing 13, as explained in the above embodiment. This is because both the set of slits 83*a* and the set of slits 83*b* can be simultaneously formed for the room 16, thereby improving the cooling efficiency for the CPU 15. However, the set of slits 83*a* or the set of slits 83*b* may be formed for the room 16 if it is sufficient for a required cooling performance.

The set of slits 83*a* and the set of slits 83*b* are provided for discharging the heated air existing in the CPU room 16 in the above-described embodiment. However, the invention is not limited to this. One of the set of slits 83*a* and the set of slits 83*b* may be removed.

The duct 11 may be omitted if the top wall 22 is sufficiently close to the fan 12 of the CPU section 9. In this case, the air introduced into the room 16 is immediately blown to the heat-dissipating plate 14 through the fan 12 and therefore, a required cooling performance for the CPU 15 is realized without the duct 11.

The set of slits 81 and the set of slits 84 are placed on a straight line in the above embodiment. This is to form an air flow from the slits 81 to the slits 84 while preventing the cooling performance of the air flow from decreasing. Therefore, if a required cooling performance for the units 2 to 6 is realized, the set of slits 81 and the set of slits 84 may not be placed on a straight line. In this case, it is sufficient that an air inlet and an air outlet are provided for cooling the units 2 to 6 outside the CPU room 16.

While the preferred form of the present invention has been described, it is to be understood that modifications will be apparent to those skilled in the art without departing from the spirit of the invention. The scope of the present invention, therefore, is to be determined solely by the following claims.

What is claimed is:

1. An electronic apparatus comprising:
   a casing having a first air inlet and a first air outlet;
   at least one electronic device/unit mounted in the casing;
   a CPU mounted in the casing;
   the CPU cooperating with the at least one electronic device/unit to realize desired functions;
   a first fan, placed on said CPU for cooling the same; and
   a partition fixed in the casing in such a way as to form a first room and a second room;
   the CPU and the first fan being placed in the first room;
   the at least one electronic device/unit being placed in the second room;
   wherein the air is introduced into the first room through the first air inlet with an operation of the first fan and then, discharged from the first room through the first air outlet without contacting the least one electronic device/unit.

2. The apparatus according to claim 1, further comprising a duct provided to interconnect the first fan of the CPU and the first air inlet.

3. The apparatus according to claim 1, wherein the partition has a heat-insulating property.

4. The apparatus according to claim 1, further comprising:
   a second air inlet formed at the casing in the second room;
   a second air outlet formed at the casing in the second room to be opposite to the second air inlet; and
   a second fan mounted to face the second air outlet in the second room;
   wherein the second air inlet is used to introduce the air into the second room;
   and wherein the second air outlet is used to discharge the air introduced into the second room to the outside of the casing in such a away as to contact the least one electronic device/unit.

5. The apparatus according to claim 4, wherein the second air inlet and the second air outlet are approximately placed on a straight line.

6. The apparatus according to claim 4, wherein the second air inlet is formed at a side wall of the casing and the second air outlet is formed at an opposite side wall or the casing.

7. The apparatus according to claim 4, further comprising a duct provided to interconnect the first fan of the CPU and the first air inlet.

8. The apparatus according to claim 1, wherein the first room is located at one of rear corners or the casing.

9. The apparatus according to claim 4, wherein the first room is located at one of rear corners of the casing.

10. The apparatus according to claim 1, wherein the first room is located at one of rear corners of the casing;
    and wherein the at least one electronic device/unit is located near a front wall of the casing.

11. The apparatus according to claim 4, wherein the first room is located at one of rear corners of the casing;
    and wherein the at least one electronic device/unit, the second air inlet, and the second air outlet are located near a front wall of the casing.

12. An electronic apparatus with a separate cooling system for CPU, comprising:
    a casing for placing a plurality electronic units including CPU;
    a CPU room housing the CPU separated by heat-insulating partition from other electronic units of said apparatus;
    an inlet for introducing air from the outside to said CPU room, locating under said CPU in said casing;
    at least one outlet for releasing heated air from CPU room located on the side of said casing;
    a heat-radiating plate placed directly on the CPU;
    a cooling fan attached to said heat-radiating plate;
    a vertical air path for introducing air directly to the heat-radiating plate through said fan;
    and wherein the air introduced into the CPU room through said inlet with an operation of said fan and then discharged from the first room through said air outlet without contacting the other electronic units of said electronic apparatus.

13. The electronic apparatus as in claim 12 further comprising a duct connecting said fan and said inlet for introducing air directly to said heat-radiation plate through said fan.

14. The electronic apparatus as in claim 12 wherein said inlet is located on first side of said casing and outlets are located on orthogonal second and third sides of said casing.

15. The electronic apparatus as in claim 1 further comprising a duct connecting said fan and said inlet for introducing air directly to said heat-radiation plate through said fan.

16. The electronic apparatus as in claim 1 wherein said inlet is located on first side of said casing and outlets are located on orthogonal second and third sides of said casing.

* * * * *